US010411752B1

(12) United States Patent
Halim et al.

(10) Patent No.: US 10,411,752 B1
(45) Date of Patent: Sep. 10, 2019

(54) METHODS, APPARATUS, AND SYSTEM FOR HIGH-BANDWIDTH ON-MOLD ANTENNAS

(71) Applicant: GLOBALFOUNDRIES INC., Grand Cayman (KY)

(72) Inventors: Saquib Bin Halim, Saxony (DE); MD Sayed Kaysar Bin Rahim, Mechanicville, NY (US); Marcel Wieland, Saxony (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/174,145

(22) Filed: Oct. 29, 2018

(51) Int. Cl.

| | |
|---|---|
| ***H04B 1/38*** | (2015.01) |
| ***H04B 1/40*** | (2015.01) |
| ***H01L 23/31*** | (2006.01) |
| ***H01L 23/48*** | (2006.01) |
| ***H01L 23/552*** | (2006.01) |
| ***H01L 21/56*** | (2006.01) |
| ***H01L 21/768*** | (2006.01) |
| ***H01L 23/66*** | (2006.01) |

(52) U.S. Cl.
CPC .............. *H04B 1/40* (2013.01); *H01L 21/56* (2013.01); *H01L 21/76898* (2013.01); *H01L 23/3135* (2013.01); *H01L 23/481* (2013.01); *H01L 23/552* (2013.01); *H01L 23/66* (2013.01); *H01L 23/3128* (2013.01); *H01L 2223/6677* (2013.01)

(58) Field of Classification Search
CPC ..... H04B 1/40; H01L 21/56; H01L 21/76898; H01L 23/3135; H01L 23/481; H01L 23/66; H01L 23/3128; H01L 2223/6677
See application file for complete search history.

(56) References Cited

U.S. PATENT DOCUMENTS

| | | | | |
|---|---|---|---|---|
| 7,329,918 | B2 * | 2/2008 | Cho | H01L 27/10855 257/296 |
| 8,841,195 | B2 * | 9/2014 | Sun | H01L 27/10852 438/381 |
| 9,293,336 | B2 * | 3/2016 | Yang | H01L 21/283 |
| 2009/0184339 | A1 * | 7/2009 | Tashibu | H01L 21/76264 257/139 |
| 2012/0280860 | A1 | 11/2012 | Kamgaing et al. | |
| 2012/0299778 | A1 | 11/2012 | Yen et al. | |
| 2014/0198013 | A1 | 7/2014 | Saraswat et al. | |
| 2017/0207204 | A1 * | 7/2017 | Lin | H01L 25/105 |

* cited by examiner

*Primary Examiner* — Nhan T Le
(74) *Attorney, Agent, or Firm* — Williams Morgan, P.C.

(57) ABSTRACT

A semiconductor device comprising an on-mold antenna for transmitting and/or receiving a millimeter-wave radio frequency signal is provided. The semiconductor device includes a semiconductor layer; a polymer layer proximal to the semiconductor layer; a mold proximal to the polymer layer; a plurality of nodes proximal to the semiconductor layer and distal to the polymer layer; an antenna disposed on the mold; and a conductive element providing electrical communication between the antenna and a first node. The mold may be from 500 μm to 1000 μm thick, such as from 750 μm to 800 μm thick, such as about 775 μm.

20 Claims, 16 Drawing Sheets

METHODS, APPARATUS, AND SYSTEM FOR HIGH-BANDWIDTH ON-MOLD ANTENNAS

BACKGROUND OF THE INVENTION

Field of the Invention

Generally, the present disclosure relates to the manufacture of sophisticated semiconductor devices, and, more specifically, to various methods and systems for providing a radio frequency (RF) antenna for a semiconductor device.

Description of the Related Art

The technology explosion in the manufacturing industry has resulted in many new and innovative products manufacturing processes. The so-called millimeter wave (mm-wave) applications include devices that operate based on the electromagnetic spectrum of radio band frequencies in the range of about 30 Gigahertz (GHz) to about 300 GHz. Some applications, such as those in 5G communications and Internet of Things (IoT) applications, may operate at frequencies below 30 GHz, such as to about 28 GHz. Millimeter-wave radio waves have a wavelength in the range of about 1 millimeter (mm) to about 10 mm, which corresponds to a radio frequency of 30 GHz to about 300 GHz. This band of frequencies is sometimes referred to as extremely high frequency (EHF) frequency band range.

Implementing 5G and IoT applications produces many challenges when designing circuits for these applications. EHF applications require discontinuity free, low loss transmission paths. They also benefit from antennas that are tightly integrated with other components. However, the tight integration of the antenna with the other components typically leads to low antenna bandwidth. Typical on-die antennas have an efficiency of about 30% and a gain of about 3 dBi.

The present disclosure may address and/or at least reduce one or more of the problems identified above.

SUMMARY OF EMBODIMENTS OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

In one embodiment, the present disclosure relates to a semiconductor device, including a semiconductor layer including a first surface and a second surface; a polymer layer including a first surface and a second surface, wherein the first surface of the polymer layer is proximal to the second surface of the semiconductor layer; a mold containing a first surface and a second surface, wherein the first surface of the mold is proximal to the second surface of the polymer layer; a plurality of nodes disposed proximal to the first surface of the semiconductor layer; an antenna disposed on the second surface of the mold; a first conductive element providing electrical communication between at least a first node and the antenna; a ground element disposed in the polymer layer or on the second surface of the polymer layer; and a second conductive element providing electrical communication between at least a second node and the ground element.

In one embodiment, the present disclosure relates to an apparatus, including a plurality of semiconductor devices, wherein each semiconductor device is a described above, and wherein a first subset of the semiconductor devices is configured as a receiver antenna array, a second subset of the semiconductor devices is configured as a transmitter antenna array, or both.

In one embodiment, the present disclosure relates to a method, including forming a semiconductor layer containing a first surface and a second surface; forming a polymer layer including a first surface and a second surface, wherein the first surface of the polymer layer is proximal to the second surface of the semiconductor layer; forming a mold including a first surface and a second surface, wherein the first surface of the mold is proximal to the second surface of the polymer layer; forming a plurality of nodes disposed proximal to the first surface of the semiconductor layer; forming an antenna disposed on the second surface of the mold; forming a first conductive element providing electrical communication between at least a first node and the antenna; forming a ground element disposed in the polymer layer or on the second surface of the polymer layer; and forming a second conductive element providing electrical communication between at least a second node and the ground element.

Though not to be bound by theory, the semiconductor devices and apparatus of the present disclosure may have bandwidths of about 15-30% at an operating frequency of about 28 GHz.

BRIEF DESCRIPTION OF THE DRAWINGS

The disclosure may be understood by reference to the following description taken in conjunction with the accompanying drawings, in which like reference numerals identify like elements, and in which.

Figure 1:
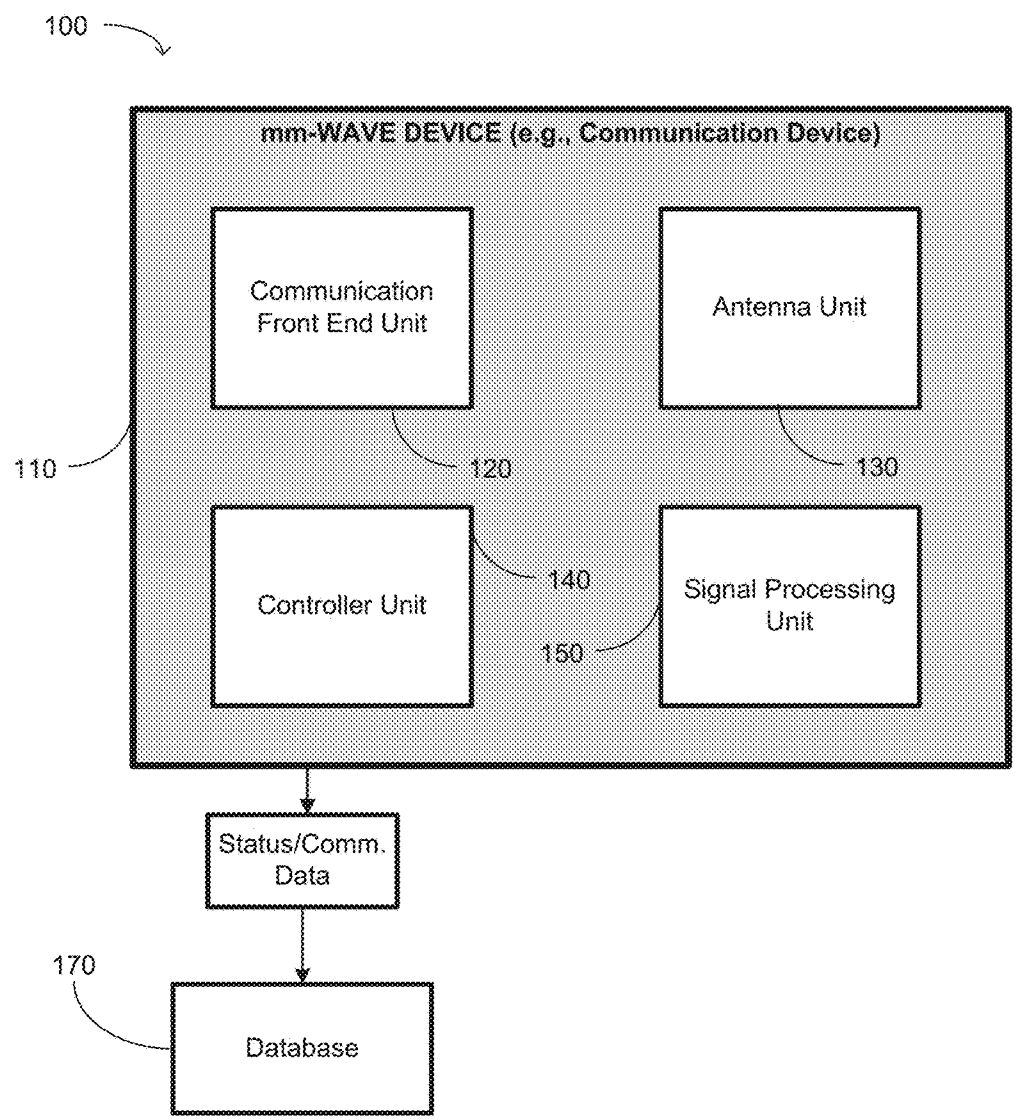
FIG. 1 illustrates a stylized block diagram representation of a communication system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein may provide for both a radio frequency (RF) and a mm-wave integrated antenna in a package having improved bandwidth.

For ease of illustration, embodiments herein is depicted within the context of a communication device, however, those skilled in the art would readily appreciate that the concepts disclosed herein may be implemented in other types of devices, such as high-speed communication devices, network devices, etc. Turning now to FIG. 1, a stylized block diagram representation of a communication system, in accordance with embodiments herein, is illustrated.

A system 100 may include an mm-wave device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a communication application. As such, the mm-wave device 110 may be often referred to below as a communication device 110. However, those skilled in the art having benefit of the present disclosure would appreciate that the concepts described herein may be applied to a variety of type of mm-wave applications, including vehicle applications using radar signals, wireless network applications, data network application, video and audio applications, etc.

The communication device 110 is capable of transmitting a communication signal and/or receiving a communication signal.

The communication device 110 may include a communication front-end unit 120, an antenna unit 130, a controller unit 140, and a signal processing unit 150. The communication front-end unit 120 may contain a plurality of components, circuit, and/or modules, and is capable of sending, receiving, and/or processing communication signals. In one embodiment, the communication device 110 may be encompassed into a single integrated circuit (IC) chip. In some embodiments, the communication device 110 may be formed on a plurality of integrated circuits that are positioned on a single IC chip. In other embodiments, communication device 110 may be formed on single integrated circuit, which is shrouded into an IC chip. In some cases, the communication front-end unit 120 may be referred simply as a communication unit 120.

The communication front-end unit 120 is capable of providing a communication signal. In one embodiment, the frequency range of the communication signals processed by the communication device 110 may be in the range of about 10 GHz to about 90 GHz. The communication front-end unit 120 is capable of generating a communication signal at a predetermined frequency range. The device 110 may process network communications for various types of communication applications, such as packet data network communications, wireless (e.g., cellular communications, IEEE 802.11ad WiGig Technology, etc.), data communications, etc. The concepts disclosed herein in the context of communication applications may also be utilized for other types of applications, such as radar, wireless communications, high-definition video, etc.

Continuing referring to FIG. 1, the antenna unit 130 may also include a transmission antenna and/or a receiver antenna. Further, each of the transmission and receiver antennas may include sub-portions to form an array of antennas. The transmission antennas are used for transmitting a communication signal, while the receiver antennas are used for receiving a communication signal. A more detailed description of the antenna unit 130 is provided in FIG. 7, and accompanying description below.

Continuing referring to FIG. 1, the communication device 110 may also contain a signal processing unit 150. The signal processing unit 150 is capable of performing various analog and/or digital processing of the signals that are transmitted and/or received by the communication device 110. For example, a communication signal transmitted by the communication device may be amplified prior to its transmission. Further, the signal received by the communication device 110 may be sent through one or more analog filter stages. The reflected signals may then be converted to a digital signal by one or more analog-to-digital converters (DAC) in the signal processing unit 150. Digital signal processing (DSP) may be performed on the digitized signal. A more detailed description of the signal processing unit 150 is provided in FIG. 6 and accompanying description below.

Continuing referring to FIG. 1, the communication device 100 may also include a controller unit 140. The controller unit 140 may perform various control operations of the communication device 110. These functions include generating a communication signal, transmitting the communication signal, receiving a communication signal, and/or processing the reflected signal.

Figure 2:
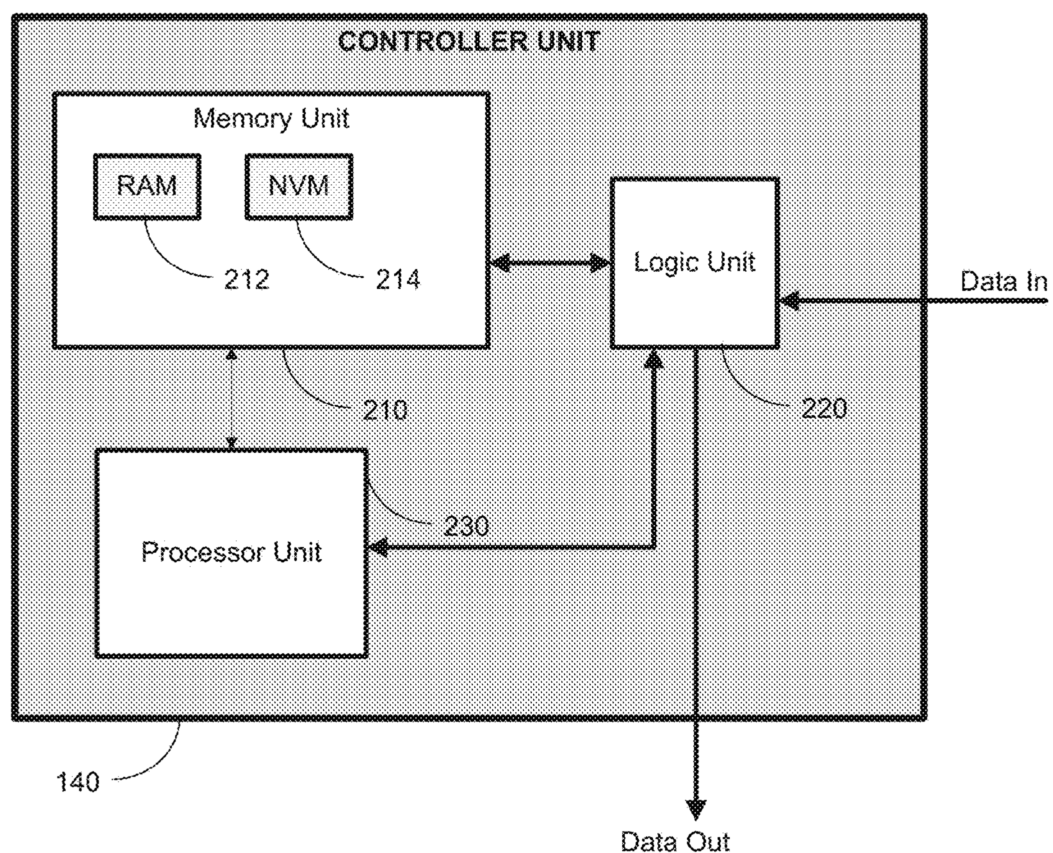
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may include a processor unit 230 capable of controlling various function of the communication device 110. The processor unit 230 may contain a microprocessor, a microcontroller, a field programmable gate array (FPGA), an application-specific integrated circuit (ASIC), and/or the like.

The controller unit 140 may also include a logic unit 220. The logic unit 220 may include a circuit that is capable of performing various logic operations, receiving data, performing interface functions with respect to input data (data_in) and output data (data_out). The signal data_in may represent data derived from processing and analyzing the reflected signal. The data_out signal may represent data generated for performing one or more tasks as a result of the communication signal transmission and the received signal. For example, the data_out signal may be used to perform an action based on communication signal transmission and/or reception.

The controller unit 140 may also contain a memory unit 210. The memory unit 210 may include a non-volatile memory 214 and a RAM 212. The non-volatile memory 214 may include FLASH memory and/or programmable read only (PROM) devices. The memory unit 210 is capable of storing operation parameters for controlling operations of the communication device 110. Further, the memory unit 210 may store the status data and the reaction data described above. The memory unit 210 may also store data that may be used to program any FPGA devices in the communication device 110. As such, the memory unit 210 may be subdivided into a program data memory, a status data memory, etc. This subdivision may be performed logically, or physically.

Figure 3:
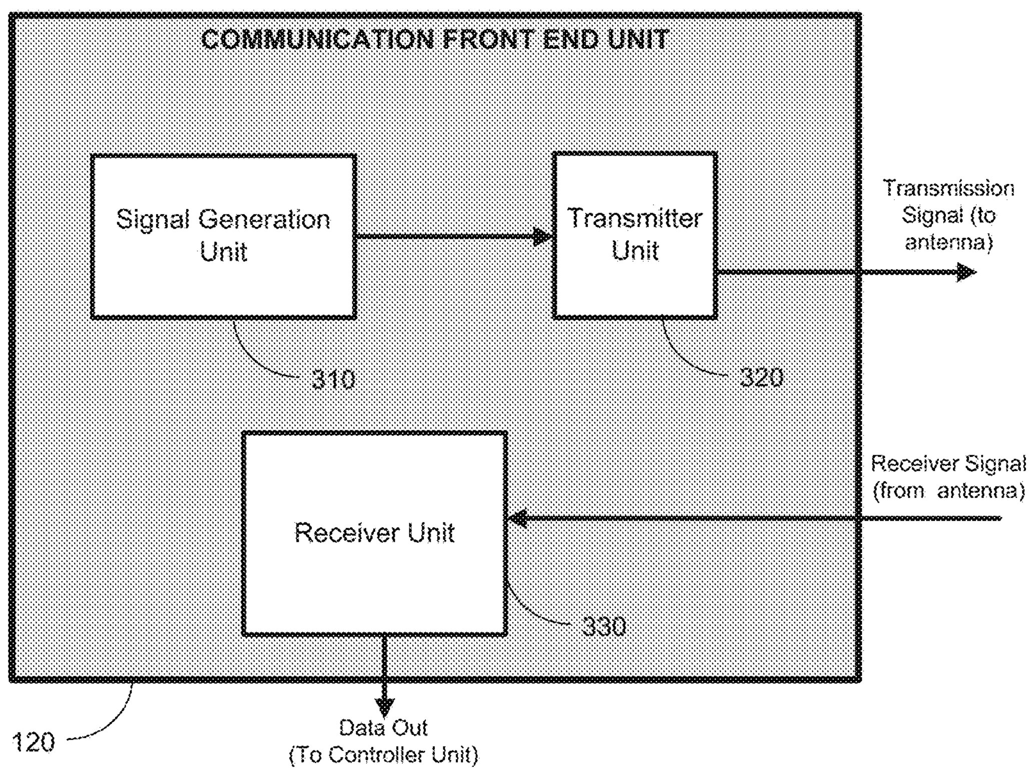
FIG. 3 illustrates a stylized block diagram depiction of the communication front end unit of FIG. 1, in accordance with embodiments herein, is illustrated.

Turning now to FIG. 3, a stylized block diagram depiction of the communication front-end unit 120, in accordance with embodiments herein, is illustrated. The communication front-end unit 120 may contain a signal generation unit 310, a transmitter unit 320, a signal processing unit 340, and a receiver unit 330. The signal generation unit 310 is capable of generating a communication signal at a predetermined frequency. For example, a signal in the range of about 70 GHz to about 85 GHz may be generated. The signal generation unit 310 may include a true differential frequency doubler (FD). The FD may be formed in a push-push configuration. The signal generation unit 310 is capable of providing a communication signal for transmission. A more detailed description of the signal generation unit 310 is provided below.

Continuing referring to FIG. 3, a signal for processing and transmission is provided by signal generation unit 310 to the transmitter unit 320. The transmitter unit 320 may include a plurality of filters, signal conditioning circuits, buffer, amplifiers, etc. for processing the signal from the signal generation unit 310. The transmission unit 320 provides a communication signal, which is to be transmitted to the antenna unit 130.

Figure 4:
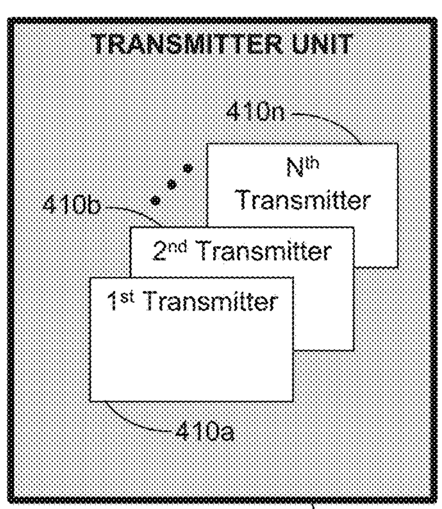
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may contain a plurality of similar transmitters, i.e., a $1^{st}$ transmitter 410*a*, a $2^{nd}$ transmitter 420*b*, through an $N^{th}$ transmitter 410*n* (collectively "410"). In one embodiment, the 1st through N[th] transmitters 410 may each process a single signal from the signal generation unit 310 and provide an output transmission signal to one or more antennas. In another embodiment, the signal generation unit 310 may provide a plurality of signals to the 1st through N[th] transmitters 410. For example, the signal generation unit 310 may provide a signal transmit signal for each transmitter 410, or alternatively, a 1st transmit signal for a first set of transmitters 410 and a 2nd transmit signal for a second set of transmitters 410.

Continuing referring to FIG. 3, a received signal is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing to the controller unit 140.

Figure 5:
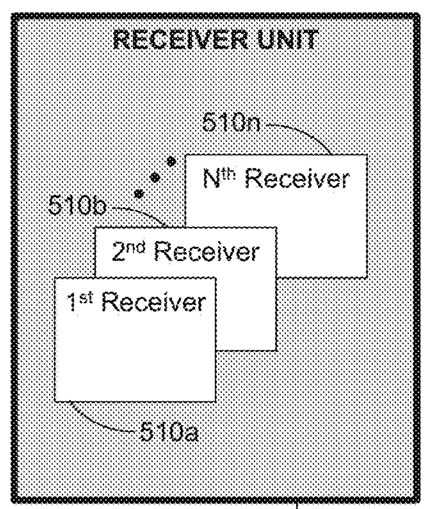
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may include a plurality of similar receivers, i.e., a 1st receiver 510*a*, a 2nd receiver 520*b*, through an Nth receiver 510*n* (collectively "510"). In one embodiment, the 1st through N[th] receiver 510 may each process a single signal from the signal generation unit 310 and provide the signal to the controller unit 140. In another embodiment, the may provide a plurality of signals to 1st the through N[th] receiver 510. For example, the signal processing unit 130 may provide a signal receive signal for each receiver 510, or alternatively, a 1st receiver signal for a first set of receivers 510 and a 2nd receiver signal for a second set of receivers 510.

Figure 6:
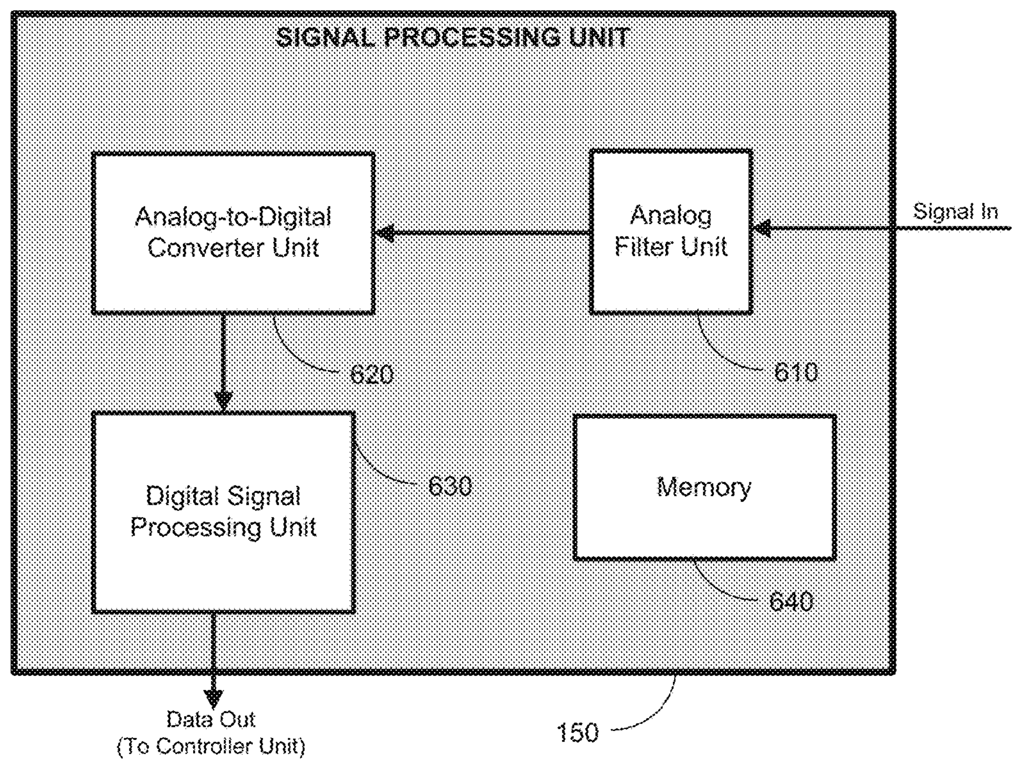
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may include an analog filter unit 610, an A/D converter 620, a DSP unit 630, and a memory 640. The analog filter unit 610 is capable of performing filtering as well as amplification of the analog signal that had been down-converted from an mm-wave signal received by the signal processing unit 150. Noise filtering may be performed by the analog filter unit 610 prior to performing amplification of the analog signal that had been down-converted from an mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may be a of an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digitized analog signal down-converted from mm-wave frequency may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
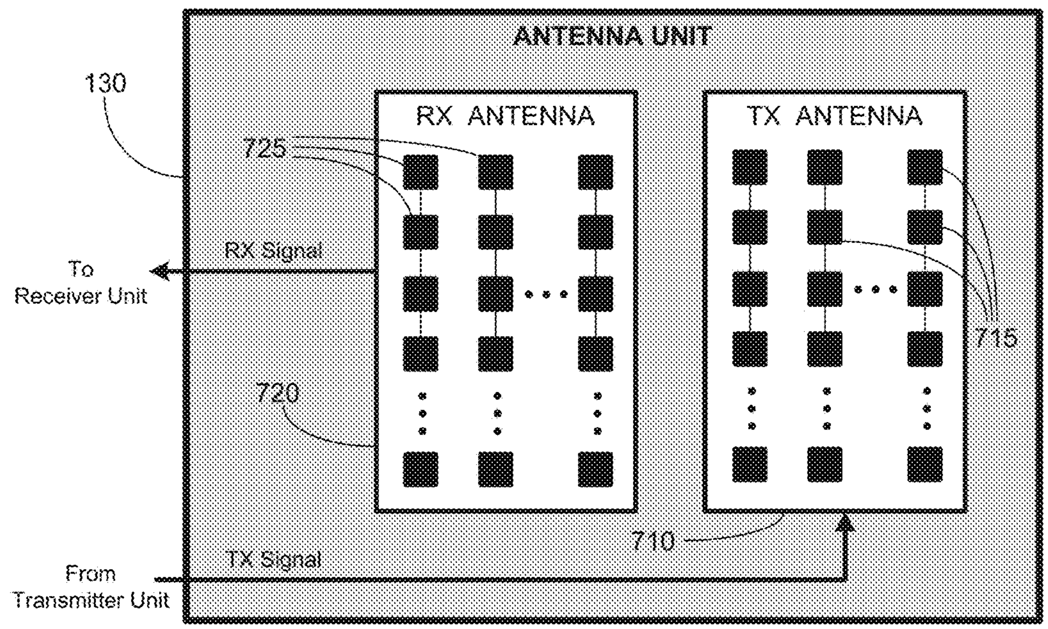
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may contain a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may include a plurality of receive antenna portions 725. The receive antenna portions 725 is also arranged in a predetermined pattern, e.g., an array matrix exemplified in FIG. 7.

Figure 8:
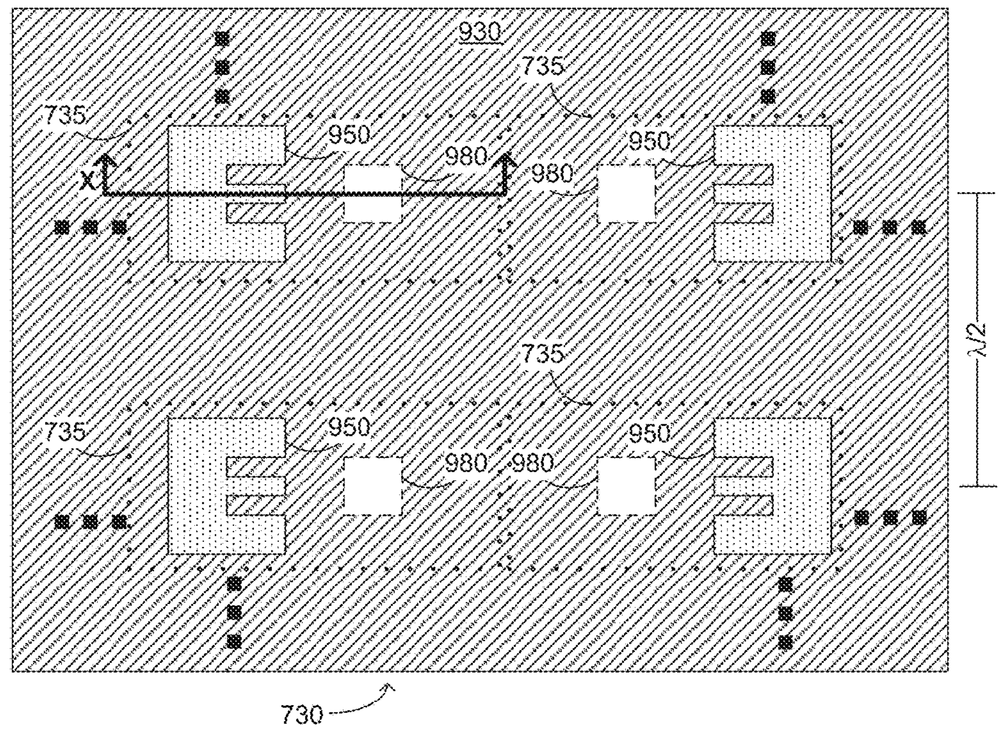
FIG. 8 illustrates a stylized far-sighted plan view of a first apparatus containing a plurality of semiconductor devices each including an antenna, in accordance with an embodiment herein.

FIG. 8 illustrates a stylized far-sighted plan view of a first apparatus 730 including a plurality of semiconductor devices 735 each containing an antenna 950, in accordance with an embodiment herein. Each of the semiconductor devices 735 may correspond to a transmitter antenna portion 715 or a receiver antenna portion 725 shown in the block diagram of FIG. 7. The first apparatus 730 may correspond to a transmitter antenna 710, a receiver antenna 720, or a combination thereof shown in the block diagram of FIG. 7.

The plan view shown in FIG. 8 shows an antenna 950 and a mold 930, which will be described in more detail below. The shape of the antenna 950 in plan view is not critical, and may be varied from the E-shape shown in FIG. 8 as a routine matter for the person of ordinary skill in the art. The plan view is farsighted in order to show the location of a radio frequency (RF) filter 980 disposed in the mold 930, as will be described in more detail below.

The plurality of semiconductor devices 735 may be configured to receive radio frequency (RF) signals, such as communication signals, at a particular frequency. By having a particular frequency, the RF signal desired to be received will also have a particular wavelength, λ. As such, in one embodiment, the semiconductor devices 735 may be arrayed in the first apparatus 730 such that the antennas 950 of adjacent semiconductor devices 735 are separated by half the particular wavelength, λ/2. Though not to be bound by theory, this separation may improve the efficiency, the sensitivity, and/or the signal-to-noise ratio of signal collection or propagation by the first apparatus 730.

FIG. 8 also shows an X-cut line, from which subsequent drawings of a semiconductor device 735 of the first apparatus 730 will be shown. The X-cut line bisects the mold 930, the antenna 950, and the RF filter 980.

Figure 9:
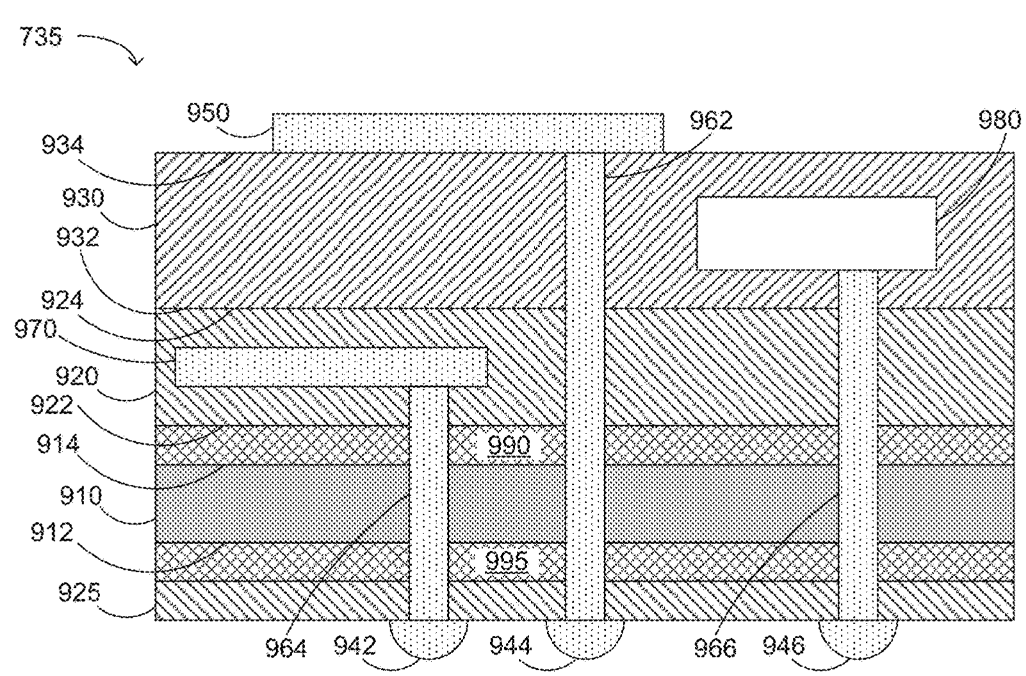
FIG. 9 illustrates a stylized X-cut cross sectional view of a semiconductor device depicted in FIG. 8, in accordance with embodiments herein.

Turning to FIG. 9, a stylized X-cut cross sectional view of a semiconductor device 735 depicted in FIG. 8, in accordance with embodiments herein, is illustrated. The semiconductor device 735 includes a semiconductor layer 910, having a first surface 912 and a second surface 914. The semiconductor layer 910 may include any semiconducting material, such as silicon or silicon-germanium, among others. When the semiconductor layer 910 contains silicon-germanium, the mole % of germanium may be selected as a routine matter by the person of ordinary skill in the art having the benefit of the present disclosure.

The semiconductor device 735 also includes a polymer layer 920, including a first surface 922 and a second surface 924. The first surface 922 of the polymer layer 920 is proximal to the second surface 914 of the semiconductor layer 910. The polymer layer 920 may contain any polymer material known in the art. In one embodiment, the polymer layer 920 includes polyimide.

The semiconductor device 735 further includes the mold 930 referred to above. The mold 930 includes a first surface 932 and a second surface 934. The first surface 932 of the mold 930 is proximal to the second surface 924 of the polymer layer 920. The mold 930 may contain any mold material known in the art. In one embodiment, the mold 930 includes Ajinomoto MI-11 (Ajinomoto Co., Inc., Tokyo, Japan).

The thickness of the mold 930 may be varied by the person of ordinary skill in the art having the benefit of the present disclosure. In one embodiment, the mold 930 has a thickness from about 500 μm to about 1000 μm. In a further embodiment, the mold 930 has a thickness from about 750 μm to about 800 μm, such as about 775 μm.

The semiconductor device 735 additionally includes a plurality of nodes 942, 944, 946 disposed proximal to the first surface 912 of the semiconductor layer 910. Each node 942, 944, or 946 contains an electrically conductive material, such as a metal, e.g. copper or aluminum, or eutectic solder alloy, among others.

Although three nodes 942, 944, 946 are shown in FIG. 9, the number of nodes may be varied as a routine matter for the person of ordinary skill in the art having the benefit of the present disclosure.

The semiconductor device 735 also includes the antenna 950 disposed on the second surface 934 of the mold 930. The antenna 950 includes an electrically conductive material, such as a metal, e.g. copper or aluminum, among others.

A first conductive element 962 is included in the semiconductor device 735 to provide electrical communication between at least a first node 944 and the antenna 950. An RF signal received by the antenna 950 may be provided to other components of a system containing semiconductor device 735 by way of the first node 944, or an RF signal generated by other components of a system including the semiconductor device 735 to be transmitted by the antenna 950 may be provided to the antenna 950 by way of the first node 944. Though shown for ease of understanding as having a uniform width through its full height, the first conductive element 962 may have wider and narrower portions, portions of different materials, etc. as will be described below and as will be apparent to the person of ordinary skill in the art.

The semiconductor device 735 also includes a ground element 970 disposed in the polymer layer 920 or on the second surface of the polymer layer. The ground element 970 may contain any electrically conductive material, such as a metal, e.g. copper or aluminum, among others. A second conductive element 964 provides electrical communication between at least a second node 942 and the ground element 970. Though not to be bound by theory, the ground element 970 may reduce interference suffered by RF signals received by antenna 950 and provided to other components of a system including semiconductor device 735, or to be transmitted by the antenna 950 and generated by other components of the system, by way of the first node 944.

In embodiments, such as that shown in FIG. 9, the semiconductor device 735 may further include a radio frequency (RF) filter 980 disposed in the mold 930. Alternatively (not shown), the RF filter 980 may be disposed on the second surface 924 of the polymer layer 920. The integration of the RF filter 980 in a die-to-wafer (D2 W) process may improve the performance of a device containing the semiconductor device 735. Also as shown, the semiconductor device 735 may further include a third conductive element 966 providing electrical communication between at least a third node 946 and the RF filter 980. Although FIG. 9 for convenience and brevity shows only one conductive element between a node and the RF filter 980, i.e., the third conductive element 966 providing electrical communication between at least a third node 946 and the RF filter 980, in other embodiments, the semiconductor device 735 may comprise two, three, four, or another number of nodes and a corresponding number of conductive elements from the nodes to the RF filter 980.

The semiconductor device 735 may also include various layers known to the person of ordinary skill in the art for use in semiconductor devices. For example, the semiconductor device 735 may contain a second polymer layer 925 disposed proximal the plurality of nodes 942, 944, and 946. The second polymer layer 925 may include a material suitable for use as a substrate for a printed circuit board. The second polymer layer 925 may, but need not, include the same material as the polymer layer 920.

For another example, the semiconductor device 735 may contain an oxide layer 990 disposed between the semiconductor layer 910 and the polymer layer 920. The oxide layer 990 may include silicon oxide and may be formed by any known technique. Alternatively or in addition, the semiconductor device 735 may include a second oxide layer 995 disposed between the second polymer layer 925 and the semiconductor layer 910.

For the sake of brevity, FIG. 9 may omit one or more structures that the person of ordinary skill in the art would routinely include in a semiconductor device.

Figure 10:
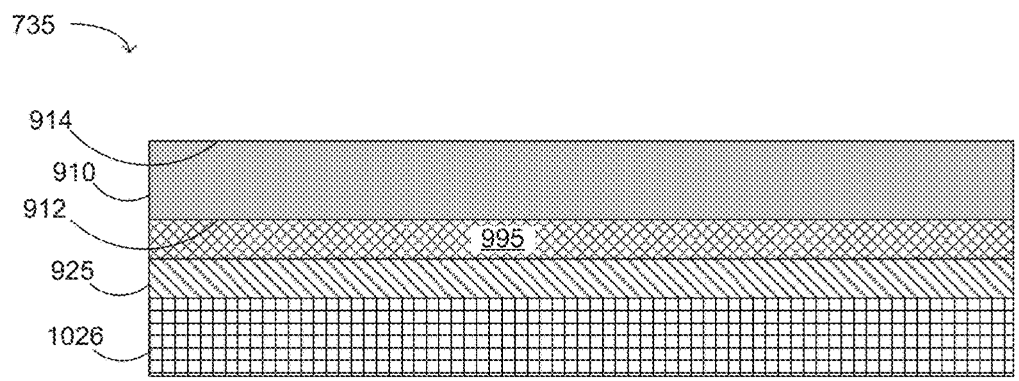
FIG. 10 illustrates a stylized X-cut cross sectional view of the semiconductor device of FIGS. 8-9 after a first stage of manufacture, in accordance with a first embodiment.

FIG. 10 illustrates a stylized X-cut cross sectional view of the semiconductor device 735 after a first stage of manufacture, in accordance with a first embodiment. In the first stage of manufacture, the semiconductor layer 910 is formed, to which the second oxide layer 995 proximal the first surface 912 of the semiconductor layer 910, the second polymer layer 925 proximal the second oxide layer 995, and a sacrificial carrier layer 1026 proximal the second polymer layer 925, may be bonded using known techniques.

Figure 11:
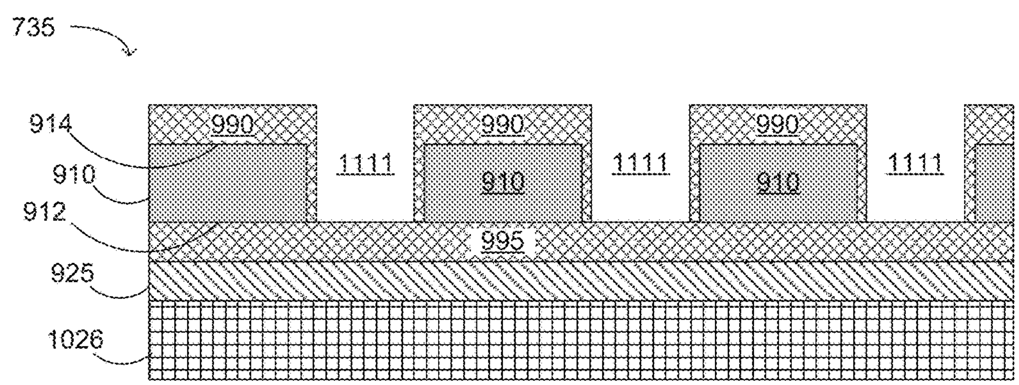
FIG. 11 illustrates a stylized X-cut cross sectional view of the semiconductor device of FIGS. 8-10 after a second stage of manufacture, in accordance with the first embodiment.

FIG. 11 illustrates a stylized X-cut cross sectional view of the semiconductor device 735 after a second stage of manufacture, in accordance with the first embodiment. In the second stage of manufacture, trenches 1111 are etched from the second surface 914 to the second surface 912 of the semiconductor layer 910, thereby exposing the second oxide layer 995. The oxide layer 990 is then deposited proximal to the second surface 914 of the semiconductor layer 910 and conformally lines the trenches 1111. Etching of the trenches 1111 and depositing the oxide layer 990 may be performed using known techniques as a routine matter by the person of ordinary skill in the art having the benefit of the present disclosure.

Figure 12:
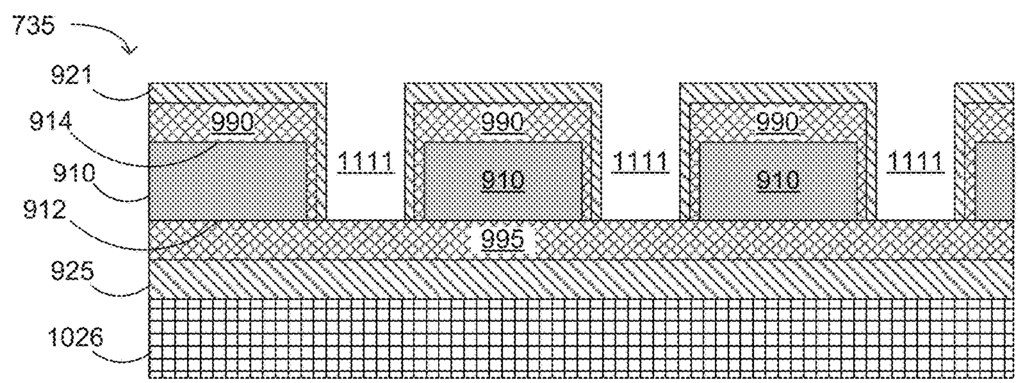
FIG. 12 illustrates a stylized X-cut cross sectional view of the semiconductor device of FIGS. 8-11 after a third stage of manufacture, in accordance with the first embodiment.

FIG. 12 illustrates a stylized X-cut cross sectional view of the semiconductor device 735 after a third stage of manufacture, in accordance with the first embodiment. A first polymer sublayer 921 is deposited over the oxide layer 990, including in the trenches 1111. Desirably, the first polymer sublayer 921 is etched at the bottom of the trenches 1111 to open up the die metal where a first conductive layer 961 (shown in FIG. 13) can land. Depositing the first polymer sublayer 921 will be a routine matter for the person of ordinary skill in the art having the benefit of the present disclosure, and need not be described in detail.

Figure 13:
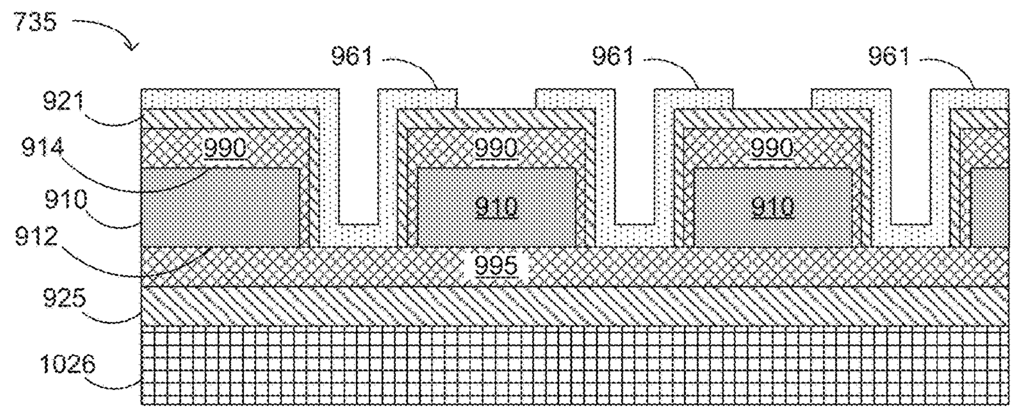
FIG. 13 illustrates a stylized X-cut cross sectional view of the semiconductor device of FIGS. 8-12 after a fourth stage of manufacture, in accordance with the first embodiment.

FIG. 13 illustrates a stylized X-cut cross sectional view of the semiconductor device 735 after a fourth stage of manufacture, in accordance with the first embodiment. In the fourth stage of manufacture, a first conductive sublayer 961 is plated over the first polymer sublayer 921. A diffusion barrier layer (not shown) may be placed prior to plating the first conductive sublayer 961. Prior to plating the first conductive sublayer 961, a mask (not shown) may be applied to portions of the first polymer sublayer 921 overlying the semiconductor layer 910, after which plating may be performed. Any standard sputtering process may be used to deposit a thin seed layer for plating the first conductive sublayer 961 on the first polymer sublayer 921. The mask may then be removed, to yield the semiconductor device 735 shown in FIG. 13.

Figure 14:
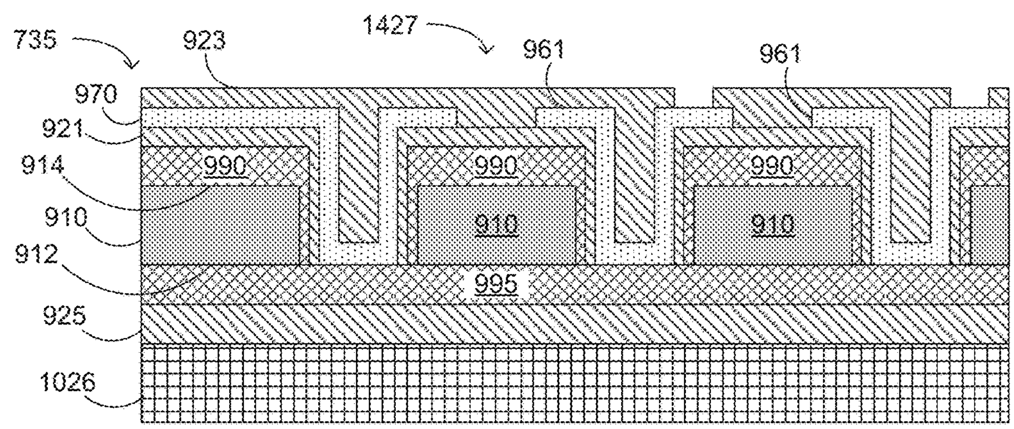
FIG. 14 illustrates a stylized X-cut cross sectional view of the semiconductor device of FIGS. 8-13 after a fifth stage of manufacture, in accordance with the first embodiment.

FIG. 14 illustrates a stylized X-cut cross sectional view of the semiconductor device 735 after a fifth stage of manufacture, in accordance with the first embodiment. In this stage of manufacture, a second polymer sublayer 923 is deposited over the first conductive sublayer 961. In positions where plating of the first conductive sublayer 961 was prevented by masking, e.g., at position 1427, the second polymer sublayer 923 may contact the first polymer sublayer 921, thereby providing electrical isolation of portions of the first conductive sublayer 961 one from another. The ground element 970 may be defined by such electrical isolation of portions of the first conductive sublayer 961.

Deposition of the second polymer sublayer 923 may be performed by known techniques. Also, prior to depositing the second polymer sublayer 923, a mask (not shown) may be applied to portions of the first conductive sublayer 961, after which depositing may be performed and the mask removed, to yield the semiconductor device 735 shown in FIG. 14.

Figure 15:
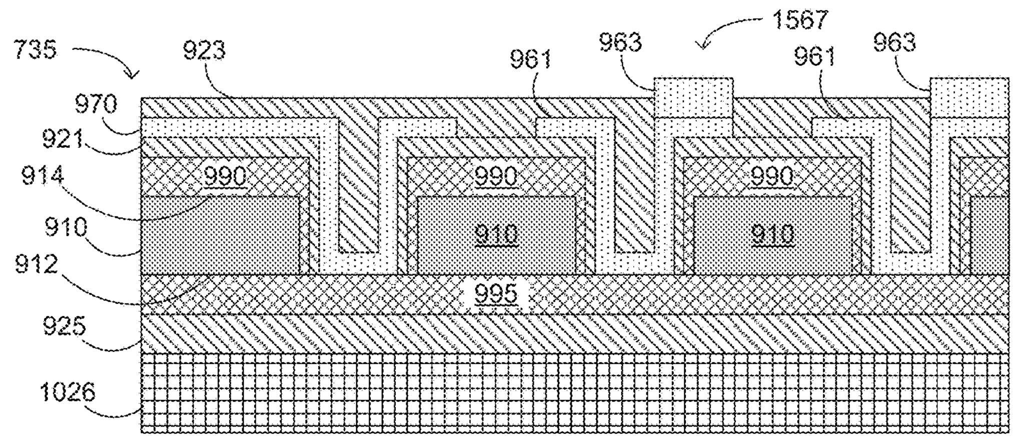
FIG. 15 illustrates a stylized X-cut cross sectional view of the semiconductor device of FIGS. 8-14 after a sixth stage of manufacture, in accordance with the first embodiment.

FIG. 15 illustrates a stylized X-cut cross sectional view of the semiconductor device 735 after a sixth stage of manufacture, in accordance with the first embodiment. In this stage of manufacture, a second conductive sublayer 963 is plated over the second polymer sublayer 923. In positions where deposition of the second polymer sublayer 923 was prevented by masking, e.g., at position 1567, the second conductive sublayer 963 may contact the first conductive sublayer 961.

Figure 16:
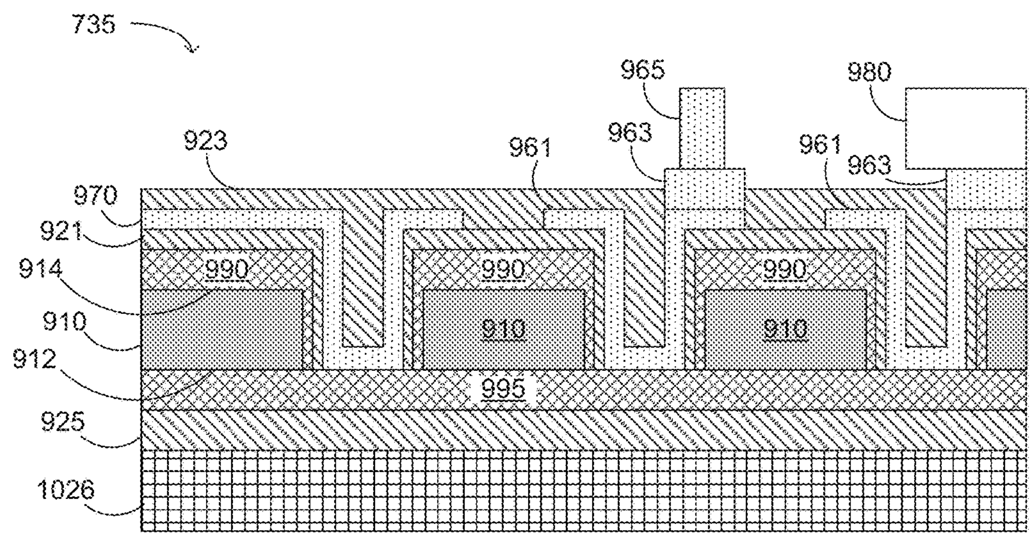
FIG. 16 illustrates a stylized X-cut cross sectional view of the semiconductor device of FIGS. 8-15 after a seventh stage of manufacture, in accordance with the first embodiment.

FIG. 16 illustrates a stylized X-cut cross sectional view of the semiconductor device 735 after a seventh stage of manufacture, in accordance with the first embodiment. In this stage of manufacture, a via bar 965 and the RF filter 980 may be formed, each in contact with the second conductive sublayer 963 and in electrical communication with portions of the first conductive sublayer 961. Formation of the via bar 965 and the RF filter 980 may be performed using known techniques and need not be described further.

Figure 17:
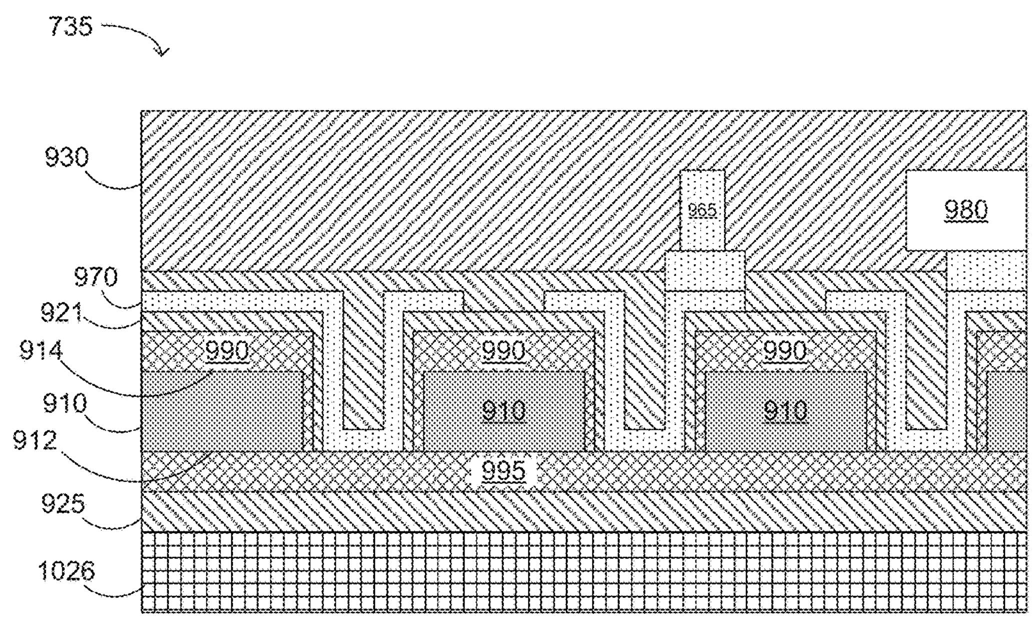
FIG. 17 illustrates a stylized X-cut cross sectional view of the semiconductor device of FIGS. 8-16 after a eighth stage of manufacture, in accordance with the first embodiment.

FIG. 17 illustrates a stylized X-cut cross sectional view of the semiconductor device 735 after an eighth stage of manufacture, in accordance with the first embodiment. In this stage of manufacture, the mold 930 is formed over the via bar 965 and the RF filter 980. Techniques for forming the mold 930 will be known to the person of ordinary skill in the art and need not be described in detail.

Figure 18:
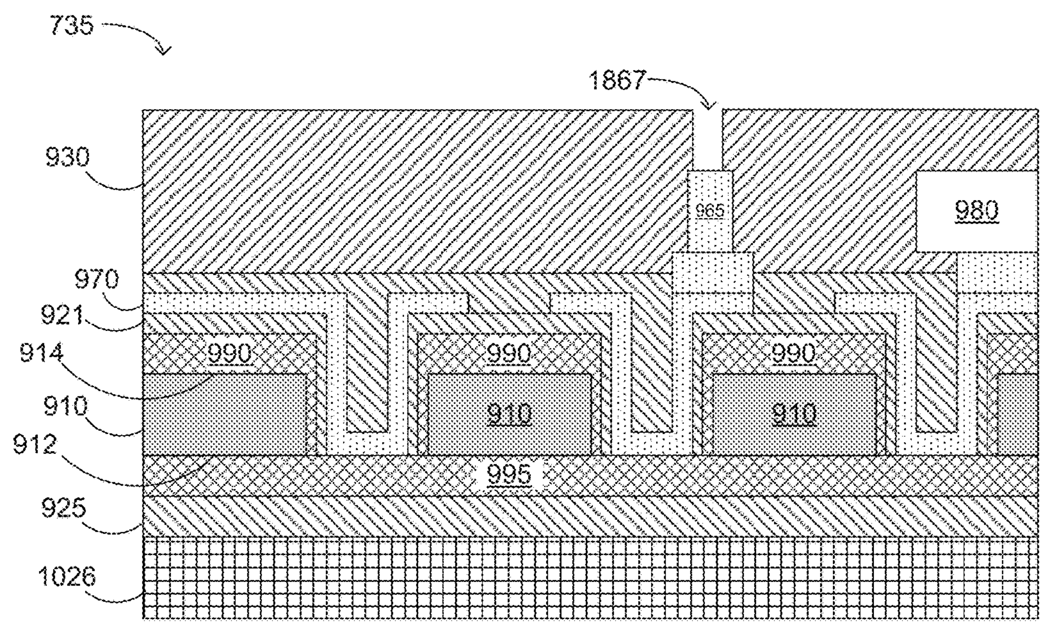
FIG. 18 illustrates a stylized X-cut cross sectional view of the semiconductor device of FIGS. 8-17 after a ninth stage of manufacture, in accordance with the first embodiment.

FIG. 18 illustrates a stylized X-cut cross sectional view of the semiconductor device 735 after a ninth stage of manufacture, in accordance with the first embodiment. In this stage of manufacture, a via opening 1867 is formed in the mold 930. In one embodiment, the via opening 1867 may be formed by performing a laser opening technique on the mold 930. Forming the via opening 1867 exposes the via bar 965 to subsequent processing steps.

Figure 19:
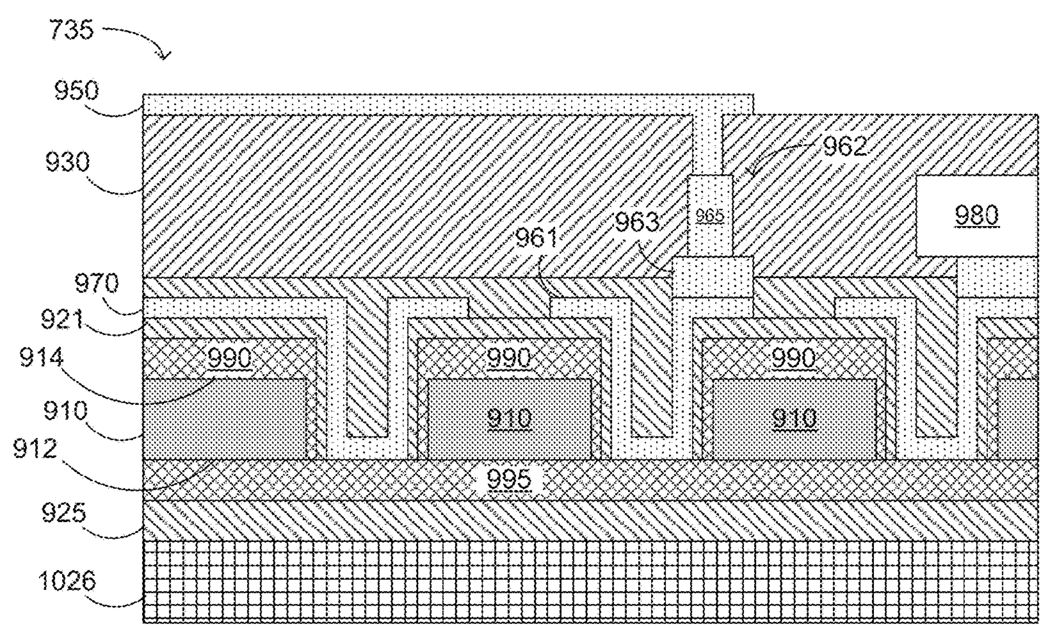
FIG. 19 illustrates a stylized X-cut cross sectional view of the semiconductor device of FIGS. 8-18 after a tenth stage of manufacture, in accordance with the first embodiment.

FIG. 19 illustrates a stylized X-cut cross sectional view of the semiconductor device 735 after a tenth stage of manufacture, in accordance with the first embodiment. In the tenth stage of manufacture, the antenna 950 is formed by depositing a conductive material on the mold 930, including over and filling the former via opening 1867 shown in FIG. 18. A diffusion barrier layer may be desired for deposition of the antenna 950. Any standard sputtering process can be used to deposit a thin seed layer for the antenna 950 on the mold 930. The antenna 950 is accordingly in electrical contact with the via bar 965, at least one portion of the second conductive sublayer 963, and at least one portion of the first conductive sublayer 961. The via bar 965, the at least one portion of the second conductive sublayer 963, and the at least one portion of the first conductive sublayer 961 together define the first conductive element 962.

Figure 20:
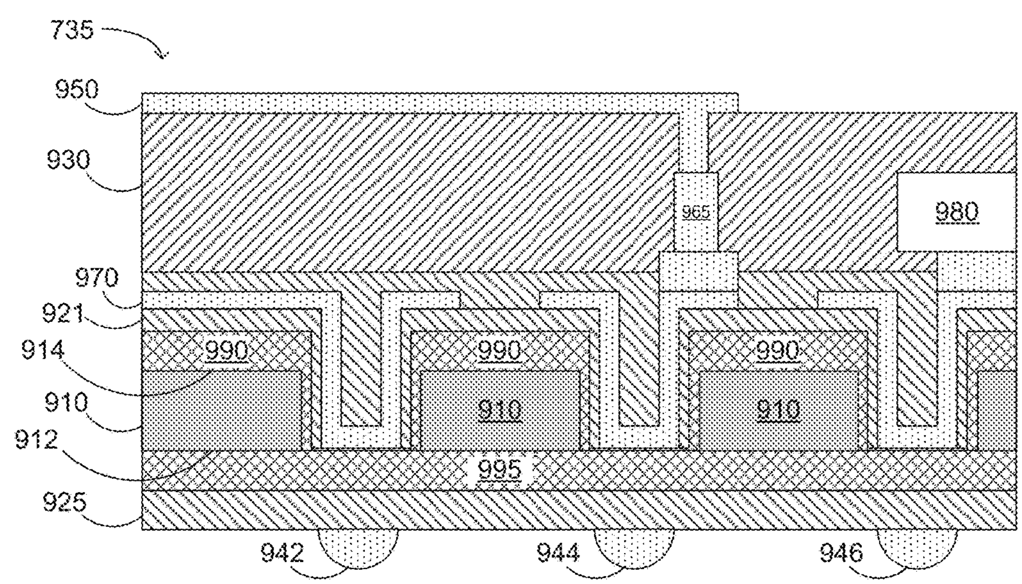
FIG. 20 illustrates a stylized X-cut cross sectional view of the semiconductor device of FIGS. 8-19 after an eleventh stage of manufacture, in accordance with the first embodiment.

FIG. 20 illustrates a stylized X-cut cross sectional view of the semiconductor device 735 after an eleventh stage of manufacture, in accordance with the first embodiment. In this manufacturing stage, the sacrificial carrier layer 1026 is removed, and frontside C4 or CuP bumping is performed, to yield a plurality of nodes 942, 944, and 946 disposed on the second polymer layer 925.

Though not to be bound by theory, a semiconductor device 735 may have a bandwidth of about 4.4 GHz and a gain of about 8 dBi for a 28 GHz signal.

Figure 21:
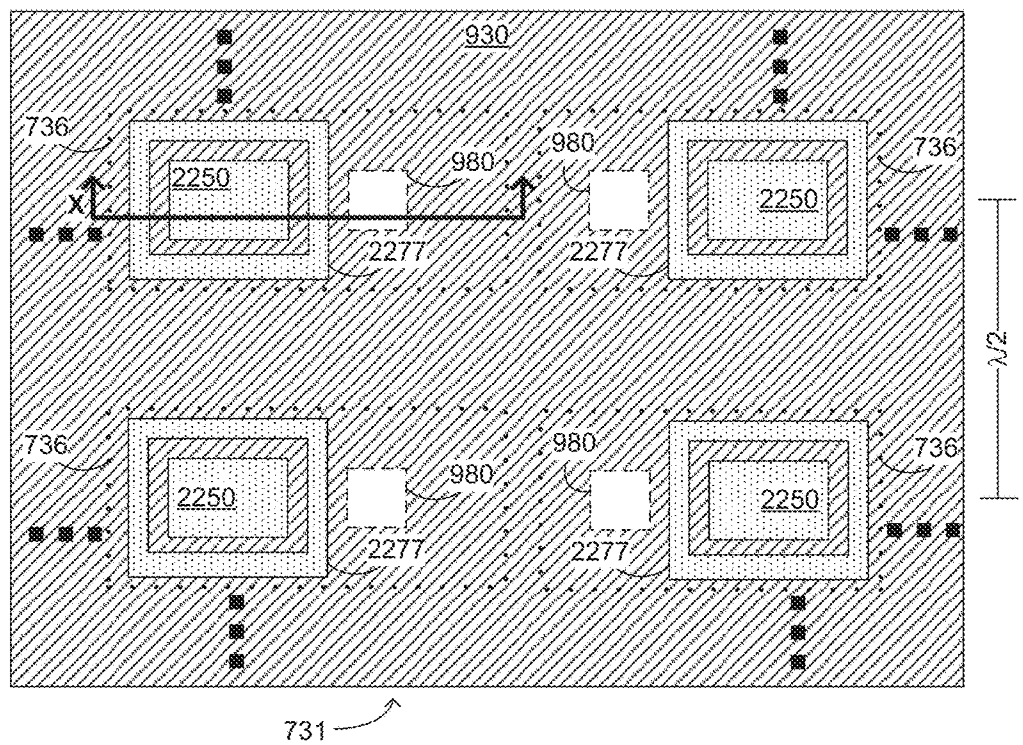
FIG. 21 illustrates a stylized far-sighted plan view of a second apparatus including a plurality of semiconductor devices each containing an antenna, in accordance with a second embodiment herein.

FIG. 21 illustrates a stylized far-sighted plan view of a second apparatus 731 containing a plurality of semiconductor devices 736 each including an antenna 2250, in accordance with a second embodiment herein. FIG. 21 has many elements in common with FIG. 8. Such common elements will be identified by the same reference numerals first set forth in FIG. 8 and will be as described therein. Generally, the second apparatus 731 is substantially similar to the first apparatus 730 shown in FIG. 9. The second apparatus 731 includes a plurality of semiconductor devices 736, which are similar to the semiconductor devices 735 shown in FIG. 9.

Newly shown in FIG. 21 is an antenna 2250, which is substantially similar to the antenna 950 shown in FIG. 9.

FIG. 21 also shows a ring 2277. In plain view, the ring 2277 surrounds the antenna 2250, but is separated from the antenna 2250 by a portion of the mold 930. The inclusion of the ring 2277 may reduce signal discontinuity and/or signal loss in each semiconductor device 736.

FIG. 21 also shows an X-cut line, from which cross-sectional depictions in FIGS. 22-28 will be taken.

Figure 22:
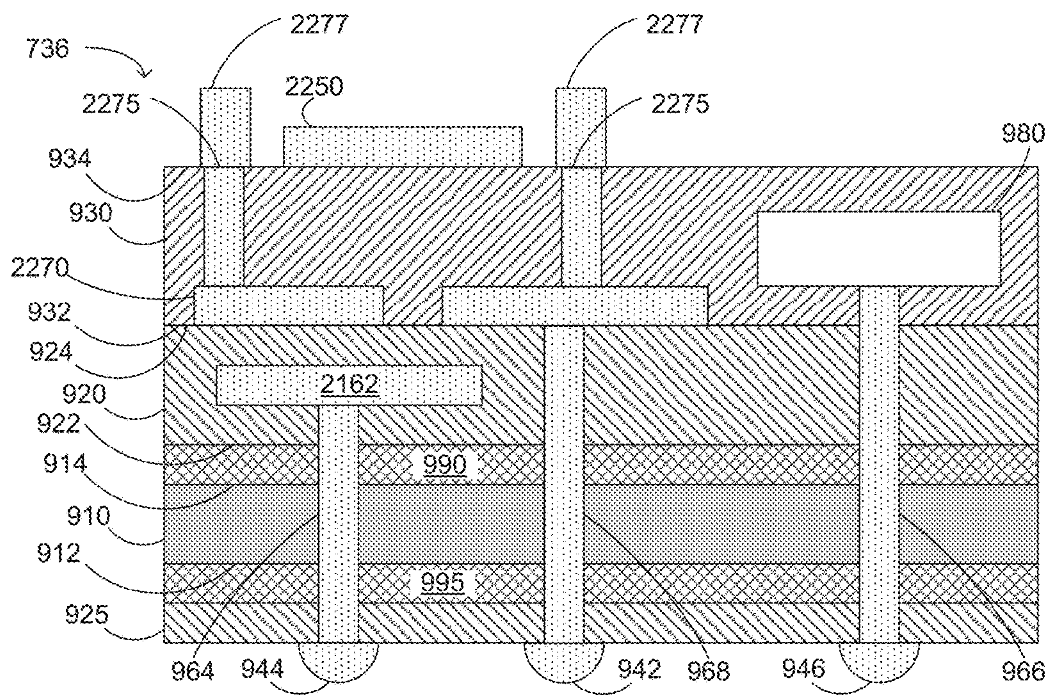
FIG. 22 illustrates a stylized X-cut cross sectional view of a semiconductor device depicted in FIG. 21, in accordance with embodiments herein.

FIG. 22 illustrates a stylized X-cut cross sectional view of a semiconductor device depicted in FIG. 21, in accordance with the second embodiment. Numerous components shown in FIG. 22 are identical or substantially similar to those shown in FIG. 10, and are designated by the same reference numerals.

A number of differences between FIG. 22 and FIG. 10 will be apparent. For one, a first conductive element 2162 is disposed in the polymer layer 920 below the antenna 2250. The first conductive element 2162 is a feeding layer providing electrical communication between the antenna 2250 and the first node 944 or, in another embodiment, the chip 910. The electrical communication provided by the first conductive element 2162 does not require physical connection; instead, in this embodiment, the slot in the ground element 2270 brings the antenna into resonance by coupling electromagnetic fields.

In this embodiment, the ground element 2270 of the semiconductor device 736 is disposed on the second surface 924 of the polymer layer 920 and contains a slot below the antenna 2250 and above the first conductive element 2162. The slot in the ground element 2270 permits the first conductive element 2162 to feed the antenna 2250

FIG. 22 also shows that the via cage 2275 extends from the ground element 2270 to the second surface 934 of the mold 930 and provides electrical communication to the ring 2277. The via cage 2275 and the ring 2277 together may be referred to herein as a "ground shield."

Figure 23:
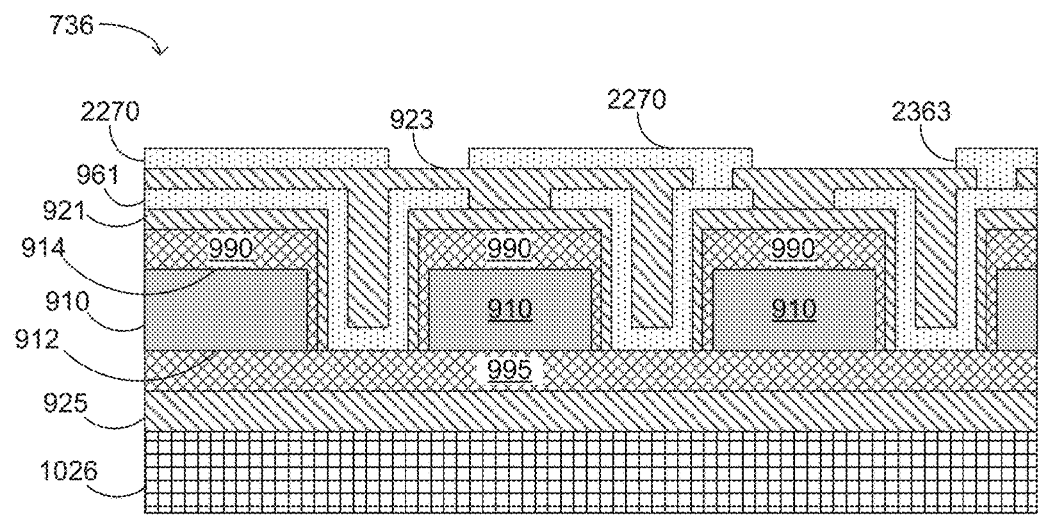
FIG. 23 illustrates a stylized X-cut cross sectional view of the semiconductor device of FIGS. 21-22 after a first stage of manufacture, in accordance with a second embodiment.

FIG. 23 illustrates a stylized X-cut cross sectional view of the semiconductor device 736 after a first stage of manufacture, in accordance with the second embodiment. The first stage of manufacture referred to herein is not the first stage of manufacture of the device. Instead, the first stage of manufacture of the second embodiment is performed on the structure shown in FIG. 14. In the first stage of manufacture of the second embodiment, a second conductive sublayer 2363 is deposited on the second polymer sublayer 923 to yield the ground element 2270 and a portion of the second conductive sublayer 2363 that will not be part of the ground path for the semiconductor device 736. The ground element 2270 is in contact with the first conductive sublayer 961. Another portion of the first conductive sublayer 961 will provide the first conductive element 2162 depicted in FIG. 22.

Figure 24:
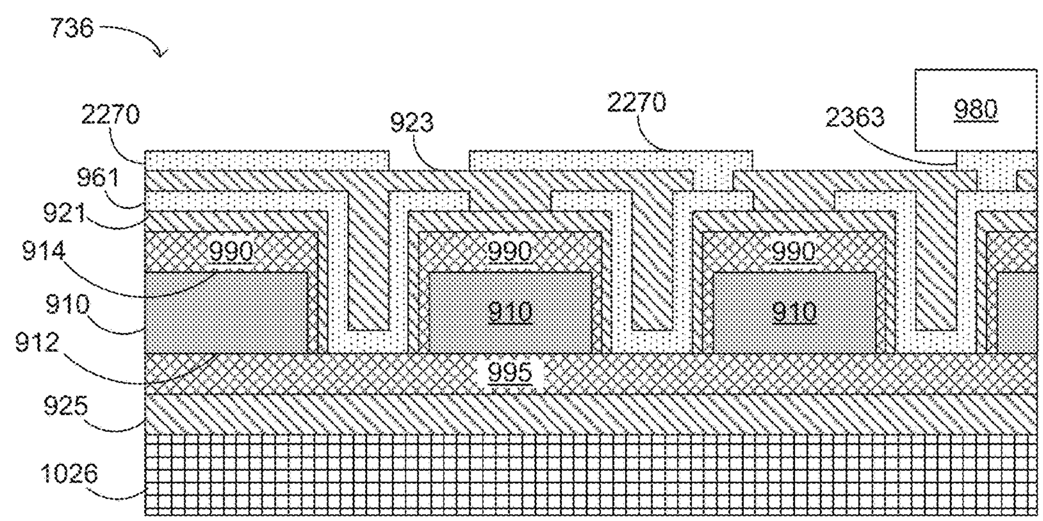
FIG. 24 illustrates a stylized X-cut cross sectional view of the semiconductor device of FIGS. 21-23 after a second stage of manufacture, in accordance with the second embodiment.

FIG. 24 illustrates a stylized X-cut cross sectional view of the semiconductor device 736 after a second stage of manufacture, in accordance with the second embodiment. In this stage of manufacture, the RF filter 980 is formed as described above.

Figure 25:
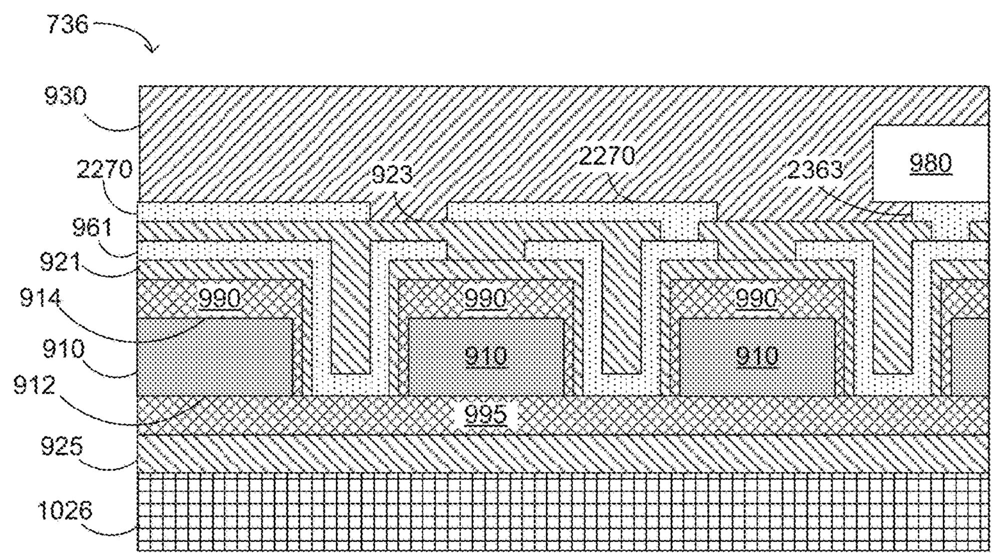
FIG. 25 illustrates a stylized X-cut cross sectional view of the semiconductor device of FIGS. 21-24 after a third stage of manufacture, in accordance with a second embodiment.

FIG. 25 illustrates a stylized X-cut cross sectional view of the semiconductor device 736 after a third stage of manufacture, in accordance with a second embodiment. In this stage of manufacture, the mold 930 is formed as described above.

Figure 26:
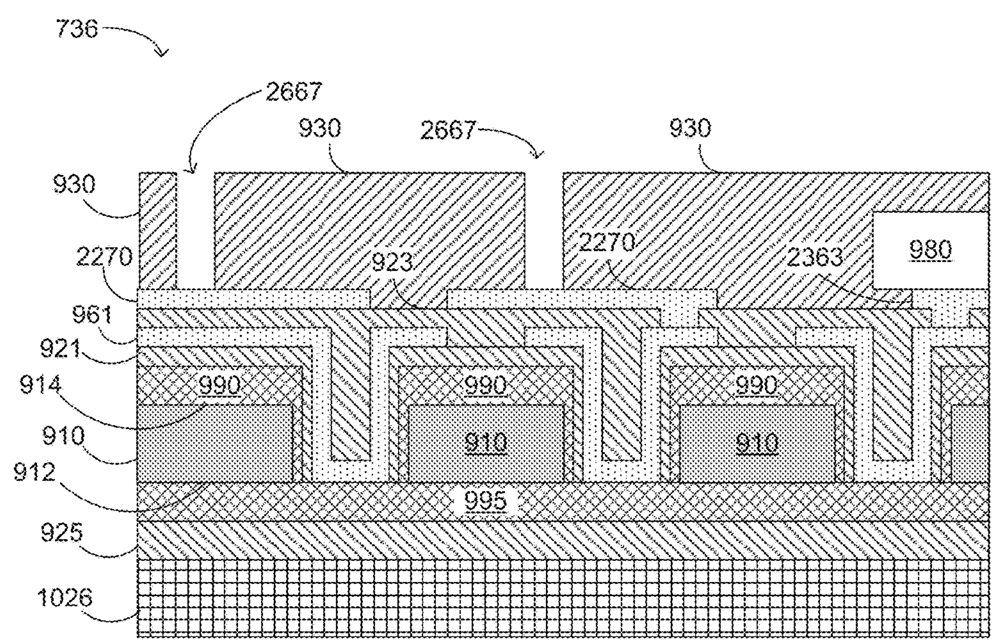
FIG. 26 illustrates a stylized X-cut cross sectional view of the semiconductor device of FIGS. 21-25 after a fourth stage of manufacture, in accordance with the second embodiment.

FIG. 26 illustrates a stylized X-cut cross sectional view of the semiconductor device 736 after a fourth stage of manufacture, in accordance with the second embodiment. In this stage of manufacture, via openings 2667 are formed in the mold 930. In one embodiment, the via opening 2667 may be formed by performing a laser opening technique on the mold 930. Forming the via openings 2667 exposes the ground element 2270 and the second ground element 2270 to subsequent processing steps.

Figure 27:
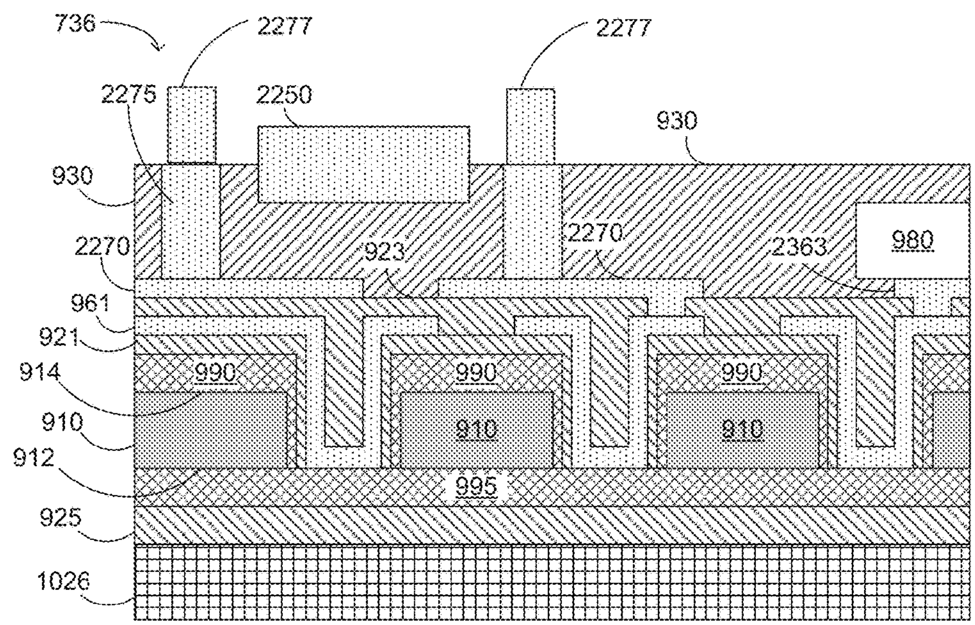
FIG. 27 illustrates a stylized X-cut cross sectional view of the semiconductor device of FIGS. 21-26 after a fifth stage of manufacture, in accordance with a second embodiment.

FIG. 27 illustrates a stylized X-cut cross sectional view of the semiconductor device 736 after a fifth stage of manufacture, in accordance with a second embodiment. In this stage of manufacture, the antenna 2250 is plated as described above regarding antenna 950. Also plated at this time is the via cage 2275 in the via openings 2667 shown in FIG. 26, followed by plating of the ring 2277. The ring 2277 may comprise aluminum. The ring 2277 may improve the directivity of the semiconductor device 736.

Figure 28:
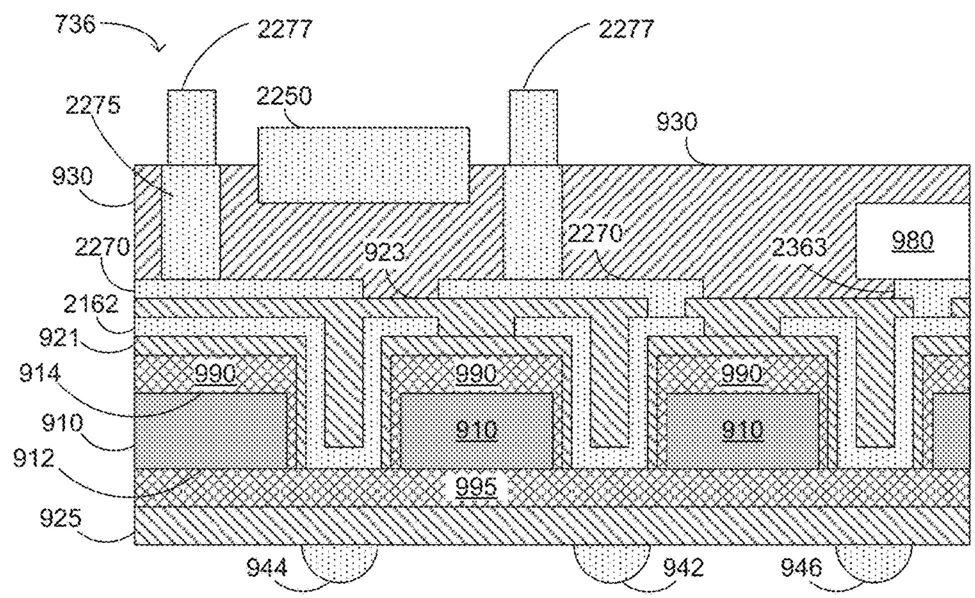
FIG. 28 illustrates a stylized X-cut cross sectional view of the semiconductor device of FIGS. 21-27 after a sixth stage of manufacture, in accordance with the second embodiment.

FIG. 28 illustrates a stylized X-cut cross sectional view of the semiconductor device 736 after a sixth stage of manufacture, in accordance with the second embodiment. In the sixth stage of manufacture, nodes 942, 944, and 946 are formed as described above.

Though not to be bound by theory, a semiconductor device 736 may have a bandwidth of about 8.1 GHz and a gain of about 7.5 dBi for a 28 GHz signal.

Figure 29:
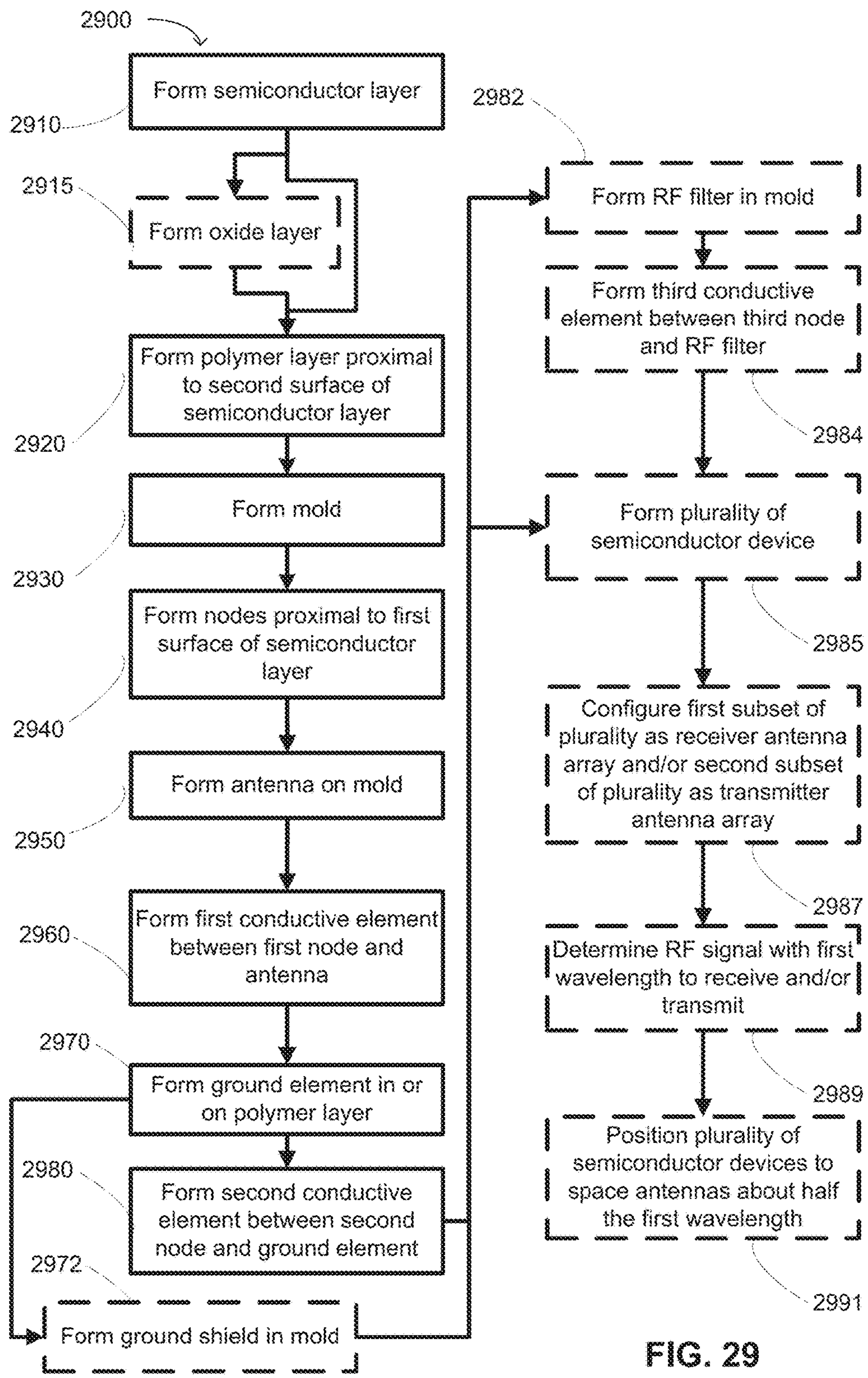
FIG. 29 provides a flowchart depicting a method of fabricating a semiconductor device, in accordance with embodiments herein.

FIG. 29 provides a flowchart depicting a method 2900 of fabricating a semiconductor device, in accordance with embodiments herein. Specifically, the method 2900 includes forming (at 2910) a semiconductor layer including a first surface and a second surface. In one embodiment, the semiconductor layer may be formed (at 2910) from silicon-germanium.

In some embodiments, the method 2900 may further contain forming (at 2915) an oxide layer adjacent the second surface of the semiconductor layer.

The method 2900 also includes forming (at 2920) a polymer layer including a first surface and a second surface, wherein the first surface of the polymer layer is proximal to the second surface of the semiconductor layer. In embodiments wherein forming (at 2915) an oxide layer was performed, the oxide layer is disposed between the semiconductor layer and the polymer layer.

The method 2900 further contains forming (at 2930) a mold including a first surface and a second surface, wherein the first surface of the mold is proximal to the second surface of the polymer layer. In one embodiment, the mold may be formed (at 2930) to have a thickness from 500 μm to 1000 μm. In a further embodiment, the mold may be formed (at 2930) to have a thickness from 750 μm to 800 μm. In one particular embodiment, the mold may be formed (at 2930) to have a thickness of 775 μm.

The method 2900 additionally includes forming (at 2940) a plurality of nodes disposed proximal to the first surface of the semiconductor layer. The method 2900 yet further contains forming (at 2950) an antenna disposed on the second surface of the mold. The method 2900 still additionally includes forming (at 2960) a first conductive element providing electrical communication between at least a first node and the antenna.

The method 2900 also includes forming (at 2970) a ground element disposed in the polymer layer or on the second surface of the polymer layer. The method 2900 further contains forming (at 2980) a second conductive element providing electrical communication between at least a second node and the ground element.

In one embodiment, when forming (at 2970) the ground element of the semiconductor device includes forming the ground element on the second surface of the polymer layer, the method 2900 may additionally include forming (at 2972) a ground shield extending from the ground element to the second surface of the mold and surrounding the antenna.

Alternatively or in addition to forming (at 2972) the ground shield, the method 2900 may further contain forming (at 2982) a radio frequency (RF) filter disposed in the mold; and forming (at 2984) a third conductive element providing electrical communication between at least a third node and the RF filter.

Alternatively or in addition to forming (at 2972) the ground shield and/or forming (at 2982) the RF filter, the method 2900 may additionally include forming (at 2985) a plurality of the semiconductor device; and at least one of configuring (at 2987) a first subset of the plurality of semiconductor devices as a receiver antenna array, configuring a second subset of the plurality of semiconductor devices as a transmitter antenna array, or both. In this embodiment, the method may further include determining (at 2989) a first wavelength of an RF signal for the semiconductor device to receive, transmit, or both; and positioning (at 2991) the plurality of the semiconductor devices, such that a spacing between the antennas of proximal semiconductor devices is about half the first wavelength.

Figure 30:
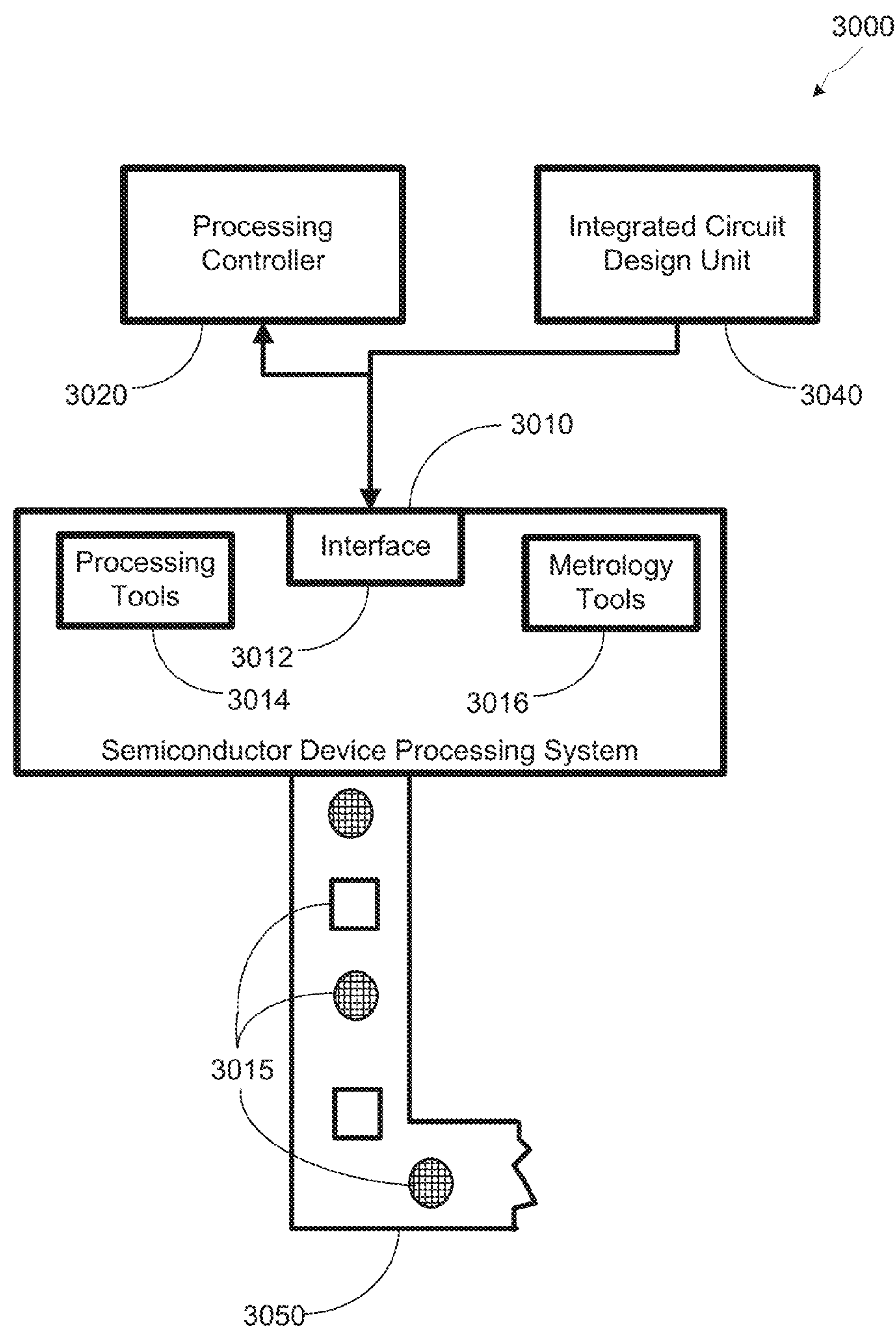
FIG. 30 illustrates a stylized depiction of a system for fabricating a semiconductor device, in accordance with embodiments herein.

FIG. 30 illustrates a stylized depiction of a system for fabricating a semiconductor device, in accordance with embodiments herein. The system 3000 provides for forming an integrated circuit having the features described above with regard to one or more of FIGS. 8-28, and may form a product having the features described above with regard to one or more of FIGS. 1-28.

The system 3000 of FIG. 30 may contain a semiconductor device processing system 3010 and an integrated circuit design unit 3040. The semiconductor device processing system 3010 may manufacture integrated circuit devices based upon one or more designs provided by the integrated circuit design unit 3040.

The semiconductor device processing system 3010 may include various processing stations, such as deposition (e.g., ALD, PECVD, etc.) stations, etch process stations, photolithography process stations, CMP process stations, etc. One or more of the processing steps performed by the processing system 3010 may be controlled by the processing controller 3020. The processing controller 3020 may be a workstation computer, a desktop computer, a laptop computer, a tablet computer, or any other type of computing device including one or more software products that are capable of controlling processes, receiving process feedback, receiving test results data, performing learning cycle adjustments, performing process adjustments, etc.

The semiconductor device processing system 3010 may produce integrated circuits on a medium, such as silicon wafers. More particularly, the semiconductor device processing system 3010 may produce integrated circuits containing one or more semiconductor devices 735 and/or 736.

The production of integrated circuits by the device processing system 3010 may be based upon the circuit designs provided by the integrated circuits integrated circuit design unit 3040. The processing system 3010 may provide processed integrated circuits/devices 3015 on a transport mechanism 3050, such as a conveyor system. In some embodiments, the transport system may be sophisticated clean room transport systems that are capable of transporting semiconductor wafers. In one embodiment, the semiconductor device processing system 3010 may include a plurality of processing steps to perform deposition of material including intrinsic stress into gate cut regions.

In some embodiments, the items labeled "3015" may represent individual wafers, and in other embodiments, the items 3015 may represent a group of semiconductor wafers, e.g., a "lot" of semiconductor wafers. The integrated circuit or device 3015 may be a transistor, a capacitor, a resistor, a memory cell, a processor, and/or the like.

The integrated circuit integrated circuit design unit 3040 of the system 3000 is capable of providing a circuit design that may be used by the semiconductor processing system 3010 to manufacture devices described herein.

The system 3000 may be capable of performing analysis and manufacturing of various products involving various technologies. For example, the system 3000 may design and production data for manufacturing devices of CMOS technology, Flash technology, BiCMOS technology, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. A semiconductor device, comprising:

a semiconductor layer comprising a first surface and a second surface;

a polymer layer comprising a first surface and a second surface, wherein the first surface of the polymer layer is proximal to the second surface of the semiconductor layer;

a mold comprising a first surface and a second surface, wherein the first surface of the mold is proximal to the second surface of the polymer layer;

a plurality of nodes disposed proximal to the first surface of the semiconductor layer;

an antenna disposed on the second surface of the mold; and a first conductive element providing electrical communication between at least a first node and the antenna.

2. The semiconductor device of claim 1, wherein the mold has a thickness ranging from about 500 μm to about 1000 μm.

3. The semiconductor device of claim 1, further comprising:

a ground element disposed in the polymer layer or on the second surface of the polymer layer; and a second conductive element providing electrical communication between at least a second node and the ground element.

4. The semiconductor device of claim 1, further comprising:

a radio frequency (RF) filter disposed in the mold; and a third conductive element providing electrical communication between at least a third node and the RF filter.

5. The semiconductor device of claim 3, wherein the ground element is disposed on the second surface of the polymer layer, and the semiconductor device further comprises a ground shield extending from the ground element to the second surface of the mold and surrounding the antenna.

6. The semiconductor device of claim 1, wherein the semiconductor layer comprises silicon or silicon-germanium.

7. An apparatus, comprising:

a plurality of semiconductor devices, wherein each semiconductor device comprises:

a semiconductor layer comprising a first surface and a second surface;

a polymer layer comprising a first surface and a second surface, wherein the first surface of the polymer layer is proximal to the second surface of the semiconductor layer;

a mold comprising a first surface and a second surface, wherein the first surface of the mold is proximal to the second surface of the polymer layer;

a plurality of nodes disposed proximal to the first surface of the semiconductor layer;

an antenna disposed on the second surface of the mold; and a first conductive element providing electrical communication between at least a first node and the antenna;

wherein a first subset of the semiconductor devices is configured as a receiver antenna array and a second subset of the semiconductor devices is configured as a transmitter antenna array.

8. The apparatus of claim 7, wherein the mold of each semiconductor device has a thickness ranging from about 500 μm to about 1000 μm.

9. The apparatus of claim 7, wherein each semiconductor device further comprises:

a ground element disposed in the polymer layer or on the second surface of the polymer layer; and a second conductive element providing electrical communication between at least a second node and the ground element.

10. The apparatus of claim 7, wherein each semiconductor device further comprises:

a radio frequency (RF) filter disposed in the mold; and a third conductive element providing electrical communication between at least a third node and the RF filter.

11. The apparatus of claim 9, wherein the ground element of each semiconductor device is disposed on the second surface of the polymer layer, and the semiconductor device further comprises a ground shield extending from the ground element to the second surface of the mold and surrounding the antenna.

12. The apparatus of claim 7, wherein the semiconductor layer of each semiconductor device comprises silicon or silicon-germanium.

13. The apparatus of claim 7, wherein the apparatus is configured to receive, transmit, or both an RF signal having a first wavelength, and the semiconductor devices are positioned such that a spacing between the antennas of proximal semiconductor devices is about half the first wavelength.

14. A method, comprising:

forming a semiconductor layer comprising a first surface and a second surface;

forming a polymer layer comprising a first surface and a second surface, wherein the first surface of the polymer layer is proximal to the second surface of the semiconductor layer;

forming a mold comprising a first surface and a second surface, wherein the first surface of the mold is proximal to the second surface of the polymer layer;

forming a plurality of nodes disposed proximal to the first surface of the semiconductor layer;

forming an antenna disposed on the second surface of the mold; and forming a first conductive element providing electrical communication between at least a first node and the antenna.

15. The method of claim 14, wherein the forming the mold comprises forming the mold to have a thickness ranging from 500 μm to 1000 μm.

16. The method of claim 14, further comprising:

forming a ground element disposed in the polymer layer or on the second surface of the polymer layer; and forming a second conductive element providing electrical communication between at least a second node and the ground element.

17. The method of claim 14, further comprising:

forming a radio frequency (RF) filter disposed in the mold; and forming a third conductive element providing electrical communication between at least a third node and the RF filter.

18. The method of claim 16, wherein the forming the ground element comprises forming the ground element on the second surface of the polymer layer, and the method further comprises forming a ground shield extending from the ground element to the second surface of the mold and surrounding the antenna.

19. The method of claim 14, wherein the forming the semiconductor layer comprises forming the semiconductor layer from silicon-germanium.

20. The method of claim 14, further comprising:

forming a plurality of semiconductor devices, each comprising the semiconductor layer, the polymer layer, the mold, the plurality of nodes, the antenna, and the first conductive element; and:

configuring a first subset of the plurality of semiconductor devices as a receiver antenna array, configuring a second subset of the plurality of semiconductor devices as a transmitter antenna array, or both.

* * * * *